United States Patent
Matsumoto et al.

(10) Patent No.: US 6,820,324 B2
(45) Date of Patent: Nov. 23, 2004

(54) METHOD OF MANUFACTURING A RESISTOR CONNECTOR

(75) Inventors: Yoshifumi Matsumoto, Hisai (JP); Hiromi Yabutani, Hisai (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/451,161

(22) PCT Filed: Jan. 29, 2002

(86) PCT No.: PCT/JP02/00649

§ 371 (c)(1),
(2), (4) Date: Jun. 18, 2003

(87) PCT Pub. No.: WO02/061768

PCT Pub. Date: Aug. 8, 2002

(65) Prior Publication Data

US 2004/0027233 A1 Feb. 12, 2004

(30) Foreign Application Priority Data

Jan. 30, 2001 (JP) .................................. 2001-021949

(51) Int. Cl.[7] .............................................. H01C 17/00
(52) U.S. Cl. ..................... 29/610.1; 29/612; 29/613; 29/620; 219/121.69; 219/121.85; 439/620; 439/907
(58) Field of Search ............................. 29/610.1, 612, 29/613, 620; 219/121.69, 121.85; 439/620, 907

(56) References Cited

U.S. PATENT DOCUMENTS

| 5,733,501 A | * | 3/1998 | Takao et al. | ............ 420/562 |
| 5,817,194 A | * | 10/1998 | Nagai et al. | ............ 148/400 |
| 6,010,366 A | * | 1/2000 | Tanigawa et al. | ............ 439/620 |

FOREIGN PATENT DOCUMENTS

| JP | 5-218113 | 8/1993 | |
| JP | 5-275602 | 10/1993 | |
| JP | 7-272901 | 10/1995 | |
| JP | 2000-173803 | * 6/2000 | ............ H01C/7/00 |

OTHER PUBLICATIONS

Japanese Office Action and English–language translation mailed Oct. 21, 2003.

* cited by examiner

*Primary Examiner*—Carl J. Arbes
*Assistant Examiner*—Tim Phan
(74) *Attorney, Agent, or Firm*—Smith, Gambrell & Russell, LLP (57) ABSTRACT

A resistor connector (C) includes a pair of parallel lead frames (1, 1), a resistor (10) with a pair of electrodes (14, 14) and a mold resin (2). Each said lead frame (1) includes a terminal portion (1*a*) and an electrode connection portion. Said pair of electrodes (14, 14) are electrically connected to respective said electrode connection portions of said pair of lead frames (1, 1) through solder (*b*). Said mold resin (2) covers said resistor (10) so as to expose said terminal portion (1*a*, 1*a*). Said lead frame (1) includes solder flow inhibit means (40, 41) between said electrode connection portion and said terminal (1*a*) for preventing said solder (*b*) to flow towards said terminal portion (1*a*).

9 Claims, 10 Drawing Sheets

METHOD OF MANUFACTURING A RESISTOR CONNECTOR

CROSS REFERENCE TO RELATED DOCUMENTS

This application is a 371 of PCT/JP02/00649, filed on Jan. 29, 2002, which claims the benefit of Japanese Patent Application No. 2001-021949, filed Jan. 30, 2001.

TECHNICAL FIELD

The present invention relates to a resistor connector employed to restrict the current value of a control circuit, or to detect the resistance value to conduct identification of electrical components. Furthermore, the present invention relates to a manufacturing method of such a resistor connector.

BACKGROUND ART

Figure 21:
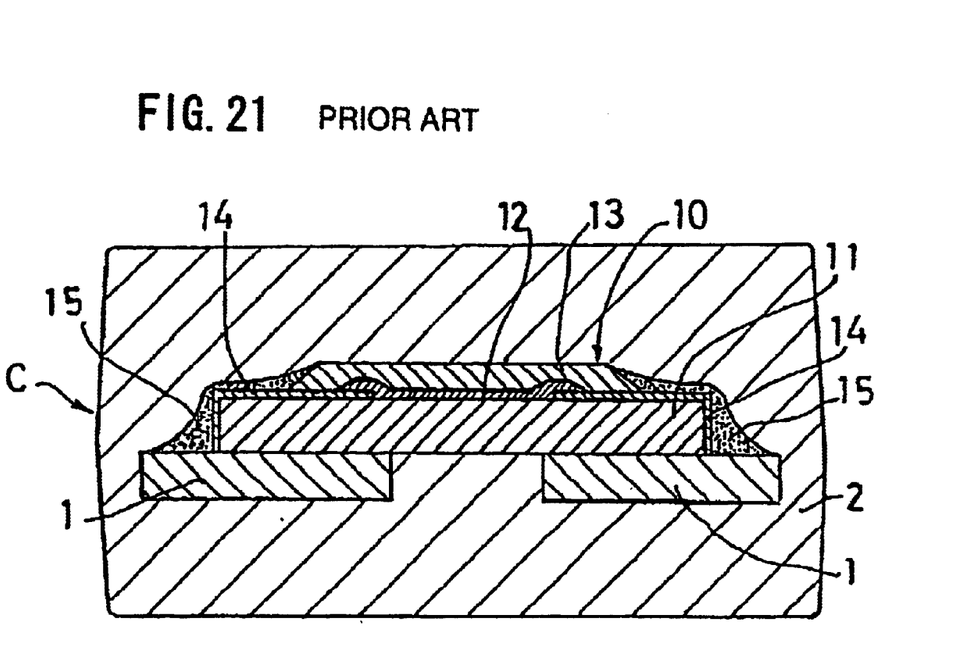
FIG. 21 is a sectional view of a resistor connector according to prior art.

An example of the above resistor connector is shown in FIG. 21. This resistor connector C has a resistor 10 fixed in a manner bridging across a pair of parallel lead frames 1, 1. Said resistor 10 is covered with a mold resin 2 in a state where the terminal portion of each lead frame 1 projects. In general, resistor 10 has a resistor unit 12 provided on a substrate 11. Resistor unit 12 is covered with a glass protection film 13, and each of electrodes 14, 14 is partially lead out from protection film 13. The portion of each electrode 14 leading out from protection film 13 is electrically connected to each lead frame 1 by solder 15. Solder 15 also serves to fasten resistor 10 to lead frame 1.

The site where this resistor connector C is installed is often in a severe environment such as in the neighborhood of the engine compartment of an automobile. Variation in temperature is significant in such an environment. Although resistor connector C exhibits variation in the resistance value depending upon the change in temperature, the variation in the resistance value must be within a tolerable range. The varying range of the resistance value is preferably as small as possible.

In this type of resistor connector C, occurrence of a crack in resistor unit 12 causes change in the resistance value. It is therefore desirable to suppress generation of a crack in resistor unit 12. However, many conventional resistor connectors already have cracks in glass protection film 13. This is considered to be caused by the molding pressure during the mold cover process and the residual strain after the molding process. If such a resistor connector C is exposed to severe change in temperature, thermal stress (thermal shock) occurs due to the difference in the coefficient of thermal expansion between mold resin 2 and resistor 10. This thermal stress causes the crack in protection film 13 to grow to result in a crack in resistor unit 12, as well as increasing the crack in resistor unit 12, when already present. Not only generation of a crack, but the growth of a crack induces a great change in the resistance value. In view of the foregoing, it is required to prevent generation of a crack in protection film 13 as well as in resistor unit 12 during the mold covering process. It is also important to prevent generation of cracks in such regions during the temperature cycle, i.e., during usage.

In view of the above requirements, the present applicant developed the approach to provide a buffer layer between resistor 10 and mold resin 2 (refer to FIG. 2 in the first embodiment of the present invention; wherein silicon resin 20 in FIG. 2 corresponds to this buffer layer), as disclosed in Japanese Patent Laying-Open No. 2000-173803. By virtue of this buffer layer, generation of a crack in resistor 10 during a mold covering process is suppressed to a minimum level. Also, even in the case where there is a severe change in temperature to cause thermal stress in resistor 10 due to the difference in the coefficient of thermal expansion between mold resin 2 and resistor 10, the thermal stress can be absorbed to suppress generation of a crack in resistor 10 during the temperature change to a minimum level.

This resistor connector C has an extremely small variation width of the resistance value during temperature change, and is highly reliable. It was considered that the scattering of the flux volatile components from the solder can be prevented by entirely covering the resistor including the solder by that buffer layer (refer to FIG. 11 of the second embodiment in the present invention).

However, it is to be noted that, at the interface between, for example, the silicon resin forming the buffer layer and the metal lead frame, secure adhesion is obtained only partially. That strength could not be achieved at the entire interface. The volatile component of the solder flux flows out from a portion of the interface to adhere to the terminal portion of the lead frame or enter and contaminate the mold resin. Adhesion to the terminal portion induces connection (contact) failure to result in a defective product. Intrusion in the mold resin will result in a defective product from the standpoint of appearance. As a result, the above-described resistor connector had an extremely low yield.

DISCLOSURE OF THE INVENTION

An object of the present invention is to prevent scattering of solder flux volatile components.

To achieve the above object, the present invention regulates the flow of solder to the terminal portion as one approach. Accordingly, the solder will not arrive at the terminal portion. Connection failure caused by adhesion of solder is eliminated.

As another approach, the flux volatile component is forced to volatilize before the mold covering process. By the forced volatilization, the amount of flux volatile component in the solder during the mold covering process is reduced. Accordingly, the amount that adheres to the terminal portion is reduced.

In view of the above object, a resistor connector of the present invention includes a pair of parallel lead frames, a resistor with a pair of electrodes, and a mold resin. Each of the above lead frames includes a terminal portion and an electrode connection portion. The pair of electrodes are electrically connected to respective electrode connection portions of the pair of lead frames. The mold resin covers the resistor so as to expose the terminal portion. The lead frame includes solder flow inhibit means between the electrode connection portion and the terminal portion for inhibiting flow of the solder towards the terminal portion.

If the cover by the mold resin is thin in the above structure, the flux volatile component may break through the thin mold resin cover due to the mold pressure and the like to flow to the surface of the cover during the covering process. To cope with the situation, a wall or trench is preferably formed so as to enclose the entire perimeter of the electrode connection portion (the solder land region). By setting the enclosed region to the least required level, the required amount of solder can be minimized. Accordingly, the absolute scattering amount of the flux volatile component can be reduced. Also, the amount of flow towards the surface of the cover can be reduced in accordance with the lower scattering amount. Furthermore, by selecting that region as the solder position (the place to mount the resistor), the solder will be gathered at the predetermined position in the region by solder fusion even if the solder print position protrudes from that region at the time of reflow. This travel causes the resistor to be shifted to the predetermined position to be attached accurately. In other words, self alignment is effected. This wall or trench is also advantageous in suppressing scattering of the flux volatile component towards the direction along the interface between the resin mold cover and the lead frame. Possible materials for the formation of this wall include resist printing, chromium coating, nickel coating, and the like that have poor wettability with respect to solder.

Preferably in the above invention, a buffer layer is provided at the interface between the resistor and the mold resin. As the material of the buffer layer, silicon resin (rubber), urethane type resin (rubber) and the like can be cited from the standpoint of heat resistance, adherence, hardness, spreadability, and the like. The buffer layer also serves to prevent scattering of the flux volatile component in addition to the role to protect the resistor, as described above. The buffer layer is preferably minimized in amount, as long as there is no problem. For example, the buffer layer may be provided only on the top plane of the resistor among the interface between the resistor and the mold resin. Alternatively, the buffer layer may be formed at the gap between the companion lead frames of the resistor in addition thereto. This is because, for the purpose of maintaining the durability, only the direct thermal stress towards the portion that requires only the minimum support is to be alleviated such as the glass protection film of the chip resistor, for example.

To achieve the above object, a method of manufacturing a resistor connector of the present invention includes a connection step of providing, by printing, solder on the electrode connection portion of the pair of parallel lead frames to electrically connect a resistor to the electrode connection portion via the solder, and a covering step of covering the resistor with mold resin so as to expose a terminal portion of the lead frame. Furthermore, the manufacturing method includes a thermal treating process of exposing the flux solid component of the solder at high temperature to carbonize sufficiently and for sufficient volatilization of the volatile component.

Volatilization of the flux volatile component can be effected by, when the resistor is to be electrically connected to the lead frame through reflow of solder as the connection step, setting the temperature, the period of time, or both the temperature and the period of time of the reflow higher, longer, or both higher and longer than the normal case. Also, a thermal treating step for carbonization and volatilization of flux can be additionally carried out after the electrical connection step by reflow of solder.

Preferably in the present invention, the solder is lead-free (solder not including lead). As lead-free solder, Sn—Ag eutectic solder, An—Ag Cu solder, and the like can be cited as examples. For example, An—Ag eutectic solder has a melting point of approximately 221° C., which is higher than the melting point of approximately 183° C. of Sn—Pb eutectic solder. Therefore, when An—Ag eutectic solder is employed, for example, the reflow temperature inevitably becomes higher to promote flux volatilization.

Preferably in the present invention, the lead frame is entirely coated with nickel, and the electrode connection portion (solder portion) is coated with silver. This provides higher heat resistance in response to the higher reflow temperature. Furthermore, affinity with the lead-free solder can be improved.

Preferably in the present invention, the lead frame has a wall or trench formed. This is more effective since the flow of solder can be inhibited. In the present invention, a step of forming a buffer layer to cover a predetermined portion of the resistor is added prior to the covering step. This is preferable from the standpoint of preventing generation of a crack in the resistor since the buffer layer is located between the resistor and the mold resin.

BEST MODE FOR PRACTICING THE INVENTION

First Embodiment

Figure 1:
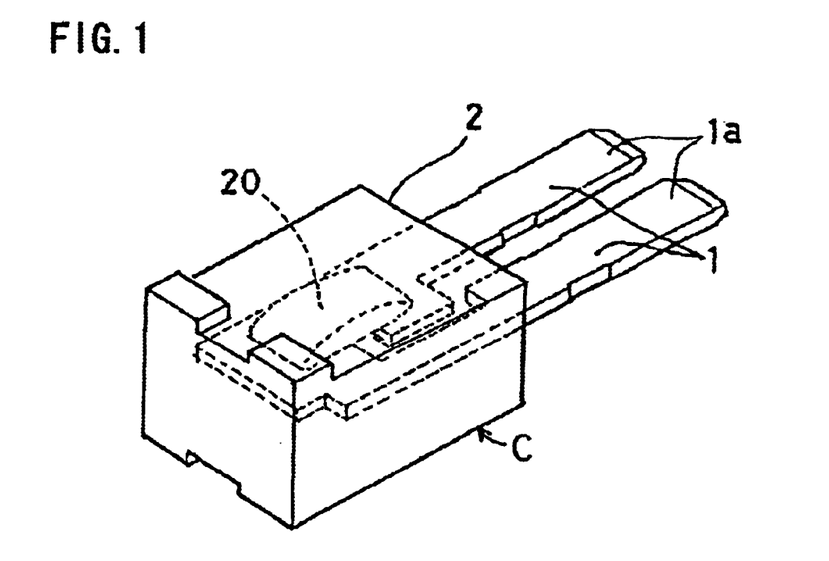
FIG. 1 is a perspective view of a resistor connector according to a first embodiment of the present invention.

A first embodiment of the present invention will be described with reference to FIGS. 1 and 2. In the present invention, likewise a conventional one, a resistor 10 is fixed in a manner bridging across a pair of lead frame 1, 1. Resistor 10 is covered with a silicon resin 20, and then further covered with a mold resin 2 which is epoxy resin containing glass. The size of resistor 10 (vertical, horizontal, thickness) is set appropriately according to the rated power requirement. Resistor 10 has a resistor unit 12 formed of ruthenic metal graze on an alumina substrate 11. Resistor unit 12 is covered with a protection film 13 formed of special lead glass. Resistor 10 has a pair of silver type electrodes 14 coated with nickel (Ni) and further coated with solder thereon, leading out from resistor unit 12. Electrode 14 is electrically connected to respective lead frame 1 through solder b.

Figure 3:
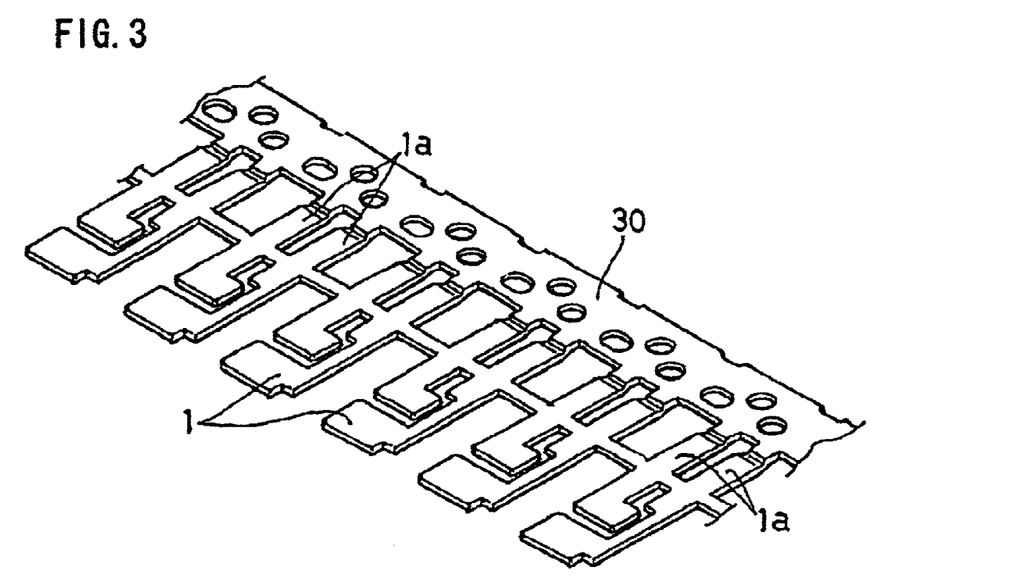
FIG. 3 is a diagram to describe a first step of a manufacturing method of the resistor connector of the first embodiment of the present invention.
Figure 4:
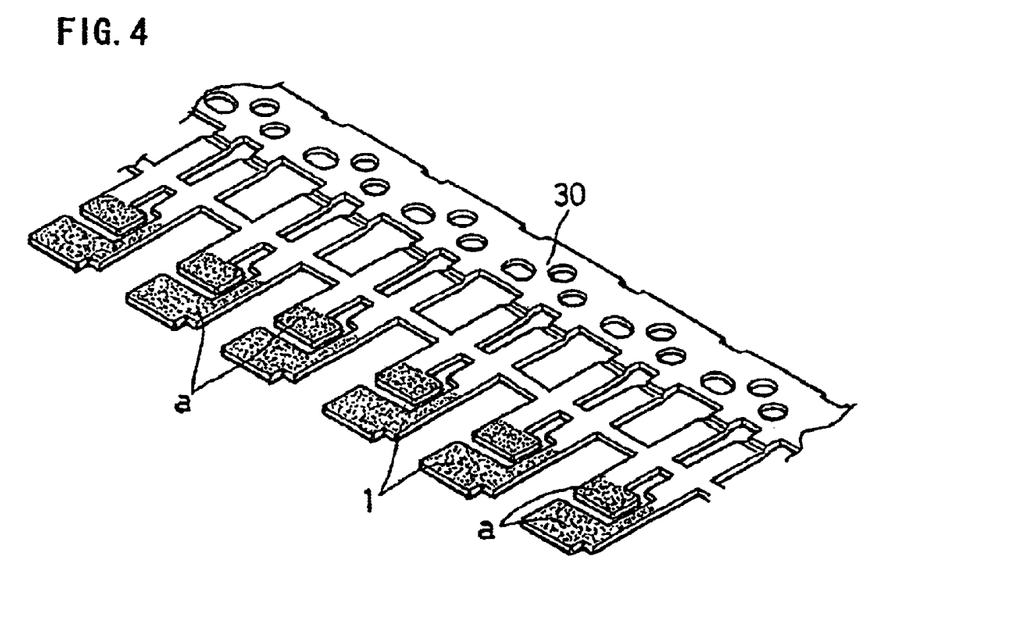
FIG. 4 is a diagram to describe a second step of the manufacturing method of the resistor connector of the first embodiment of the present invention.
Figure 5:
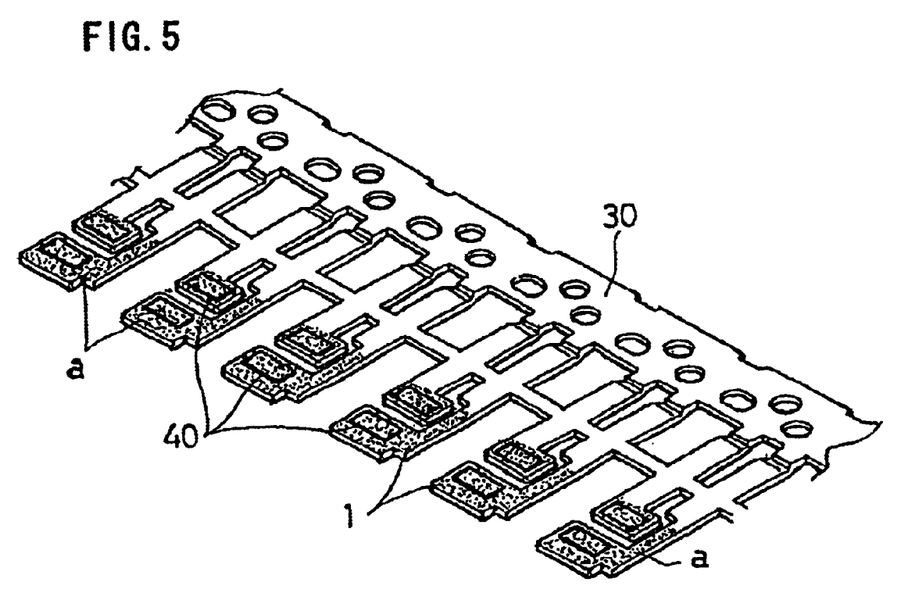
FIG. 5 is a diagram to describe a third step of the manufacturing method of the resistor connector of the first embodiment of the present invention.

A method of manufacturing the resistor connector of the first embodiment in the present invention will be described with reference to FIGS. 3–9. As shown in FIG. 3, a pair of lead frames 1 is continuously provided at a predetermined interval with respect to a lead band 30. In the present example, a plurality of lead frames 1 extend in the same direction from lead band 30. Among the plurality of lead frames 1, a longer extending one and a shorter extending one are parallel at the leading end to form a pair. Lead frame 1 is coated with Ni all over. Also, the leading end of each lead frame 1 is coated with silver a as shown in FIG. 4. This portion is where resistor 10 is to be attached. As shown in FIG. 5, at the inner area where silver coat a is provided, a wall 40 is formed so as to enclose the entire perimeter of the electrode connection portion (solder land region) to which electrode 14 of resistor 10 is to be connected. Wall 40 can be formed by resist printing using thermosetting resin such as epoxy resin. The configuration of wall 40 is arbitrary such as a rectangle or an ellipse, and the size thereof is appropriately selected taking into consideration the size of resistor 10 and the junction strength. However, in order to minimize the scattered amount of the flux volatile component, the amount of solder b is to be as low as possible while achieving the required connection strength. Furthermore, since thermosetting resin is cured when heated, an effective solder land region can be ensured in the reflow process.

Figure 6:
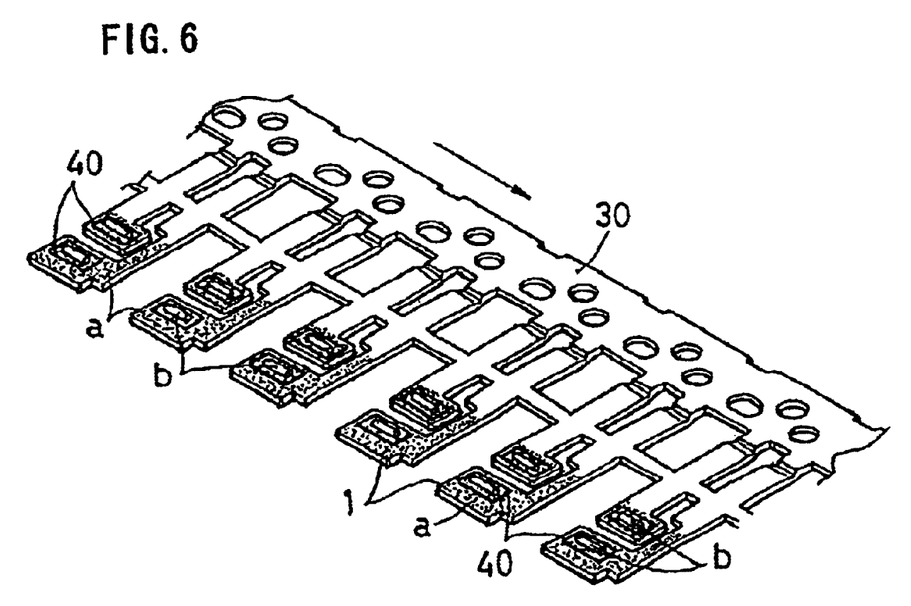
FIG. 6 is a diagram to describe a fourth step of the manufacturing method of the resistor connector of the first embodiment of the present invention.
Figure 7:
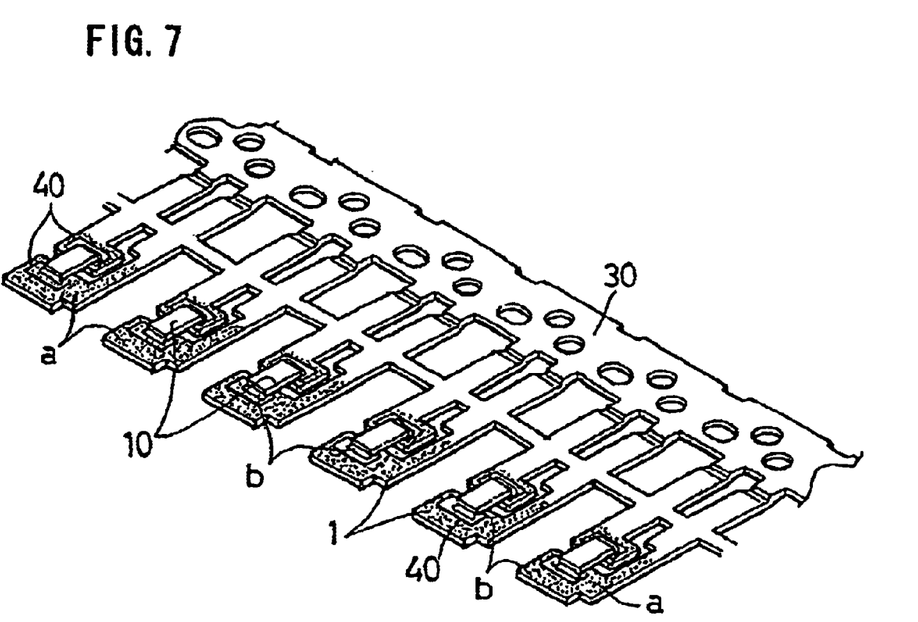
FIG. 7 is a diagram to describe a fifth step of the manufacturing method of the resistor connector of the first embodiment of the present invention.
Figure 8:
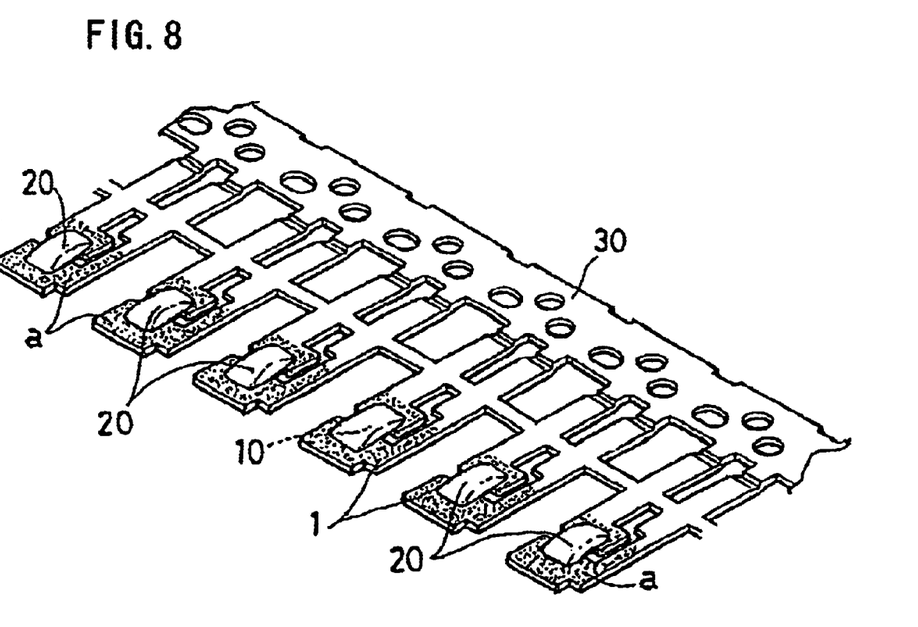
FIG. 8 is a diagram to describe a sixth step of the manufacturing method of the resistor connector of the first embodiment of the present invention.
Figure 9:
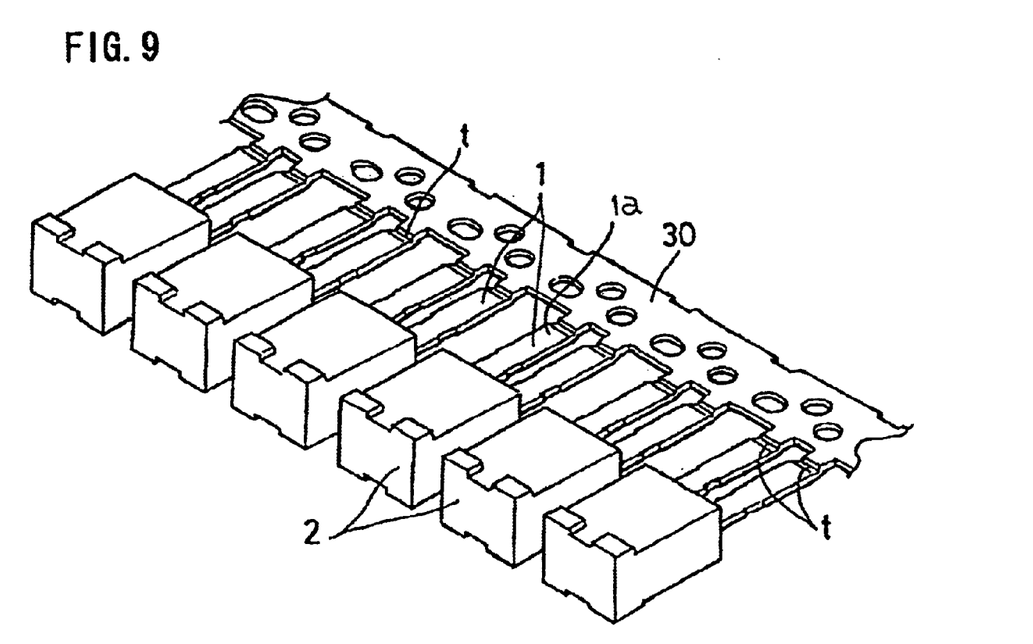
FIG. 9 is a diagram to describe a seventh step of the manufacturing method of the resistor connector of the first embodiment of the present invention.

Lead band 30 is moved in the direction of the arrow intermittently at a predetermined pitch. At a standstill during the travel, Sn (96.5%)—Ag (3.5%) eutectic solder b is applied by printing in each electrode connection portion surrounded by wall 40. FIG. 6 shows the printed state. Then, resistor 10 is mounted on solder b between a pair of lead frames 1, 1 and fixed by reflow, as shown in FIG. 7. A silicon resin is applied at the top plane of resistor 10 to form a buffer layer 20, as shown in FIG. 8. Then, as shown in FIG. 9, mold covering is conducted, whereby resistor 10 is covered together with buffer layer 20 by mold resin 2. This covering process is conducted so that terminal portion 1a of lead frame 1 is exposed. The lead frame 1 is cut off from lead band 30 at cutting line t. Thus, resistor connector C shown in FIGS. 1 and 2 is obtained.

Here, the volatilization commence temperature of the flux volatile component of the solder is approximately 150° C. Volatilization is substantially completed at approximately 2 hours at the temperature in the vicinity of 150° C. Although volatilization will be promoted if the temperature is raised to the vicinity of 270° C. which is the boiling point of flux, there is a possibility of a problem occurring in resistor unit 12. Therefore, in the resistor connector manufacturing method of the present embodiment, the reflow temperature is set to the vicinity of 250° C. (245±10° C.), and the period of time of reflow is set to approximately 10 minutes or more.

Effect•Advantage

In the present embodiment, there was no adherence of flux to terminal portion 1a of lead frame 1. Also, there was no intrusion into mold resin 2. Therefore, the yield became as high as approximately 100%.

In the present embodiment, An—Ag eutectic solder is employed with a dense particle texture for the solder portion. The solder land portion is coated with silver to improve the connection strength. Also, the melting point of the solder and the melting point of the coat are both raised. Accordingly, volatilization of the flux volatile component by the high reflow temperature is promoted. It is to be noted that the initial delamination strength at the connection portion is increased if the solder texture is dense. For example, An—Ag eutectic solder has an endurance strength superior than that of Sn—Pb solder.

Figure 2:
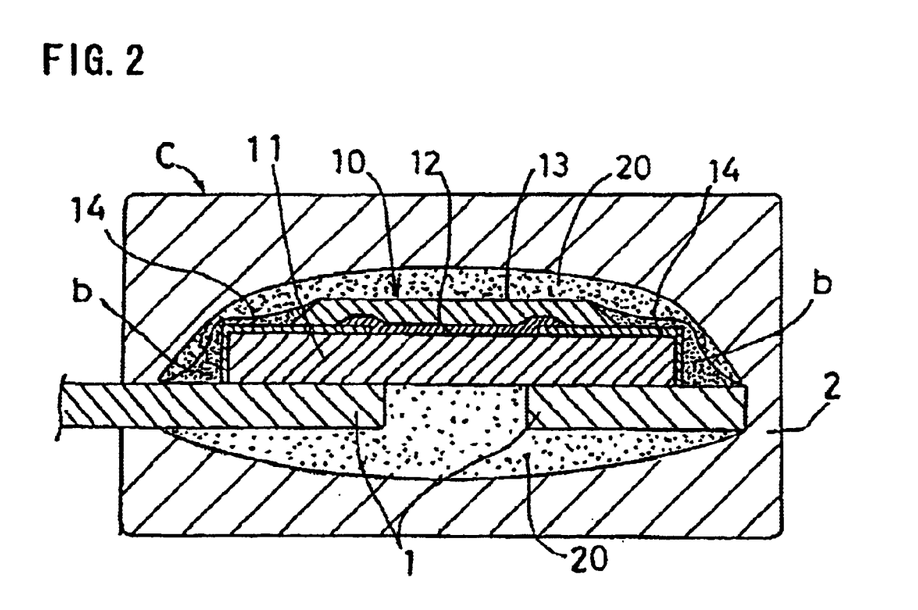
FIG. 2 is a sectional view of the resistor connector of the first embodiment of the present invention.
Figure 10:
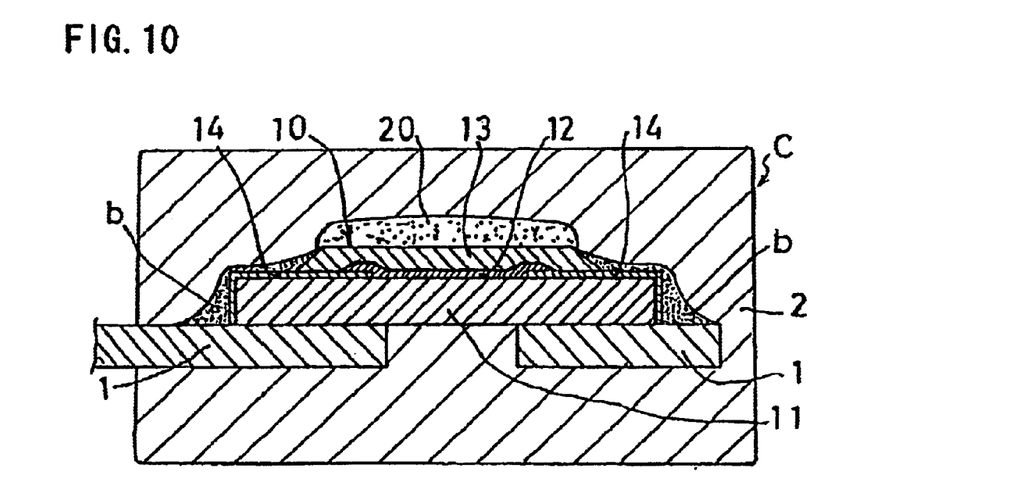
FIG. 10 is a sectional view of a first example of the resistor connector of the first embodiment of the present invention.
Figure 11:
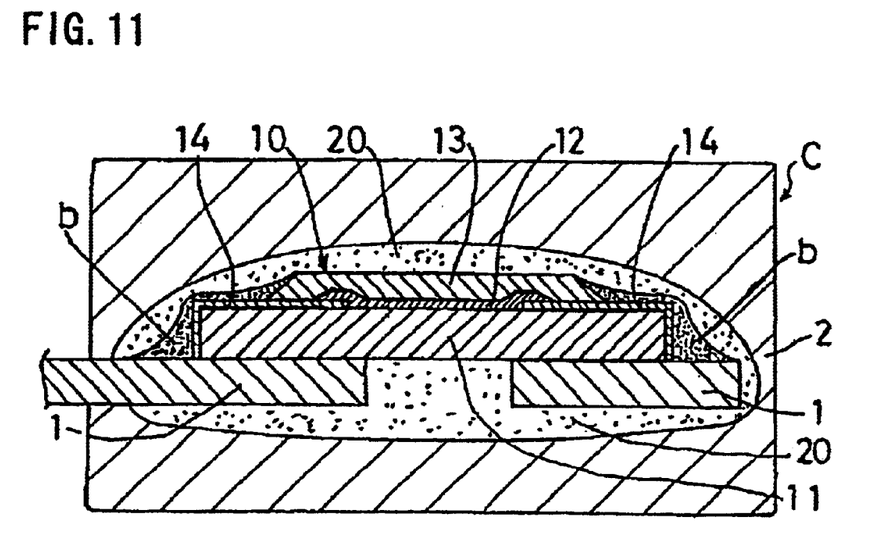
FIG. 11 is a sectional view of a second example of the resistor connector of the first embodiment of the present invention.
Figure 12:
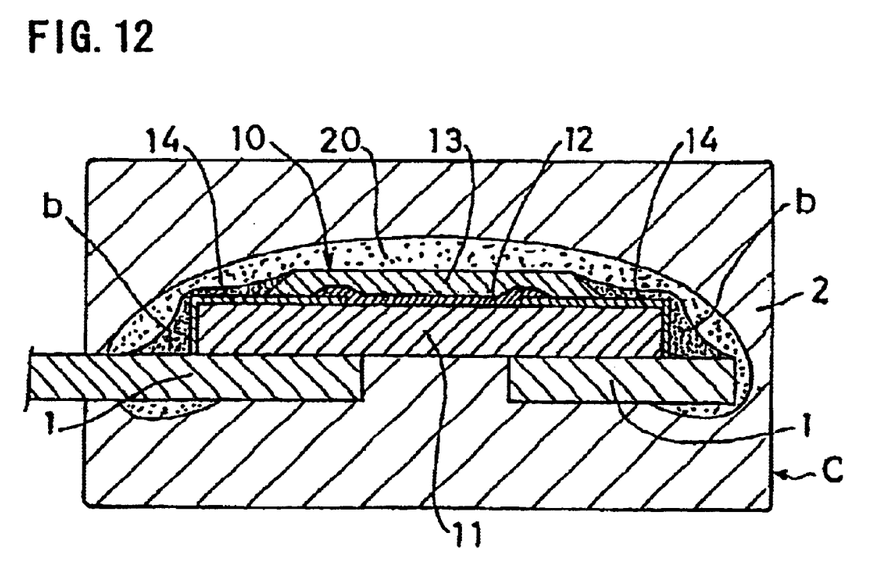
FIG. 12 is a sectional view of a third example of the resistor connector of the first embodiment of the present invention.
Figure 13:
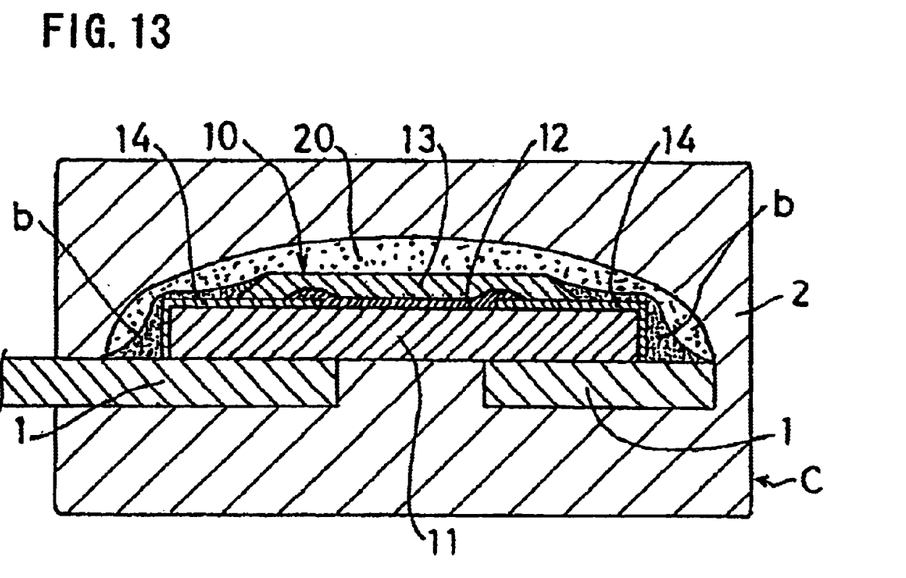
FIG. 13 is a sectional view of a fourth example of the resistor connector of the first embodiment of the present invention.
Figure 14:
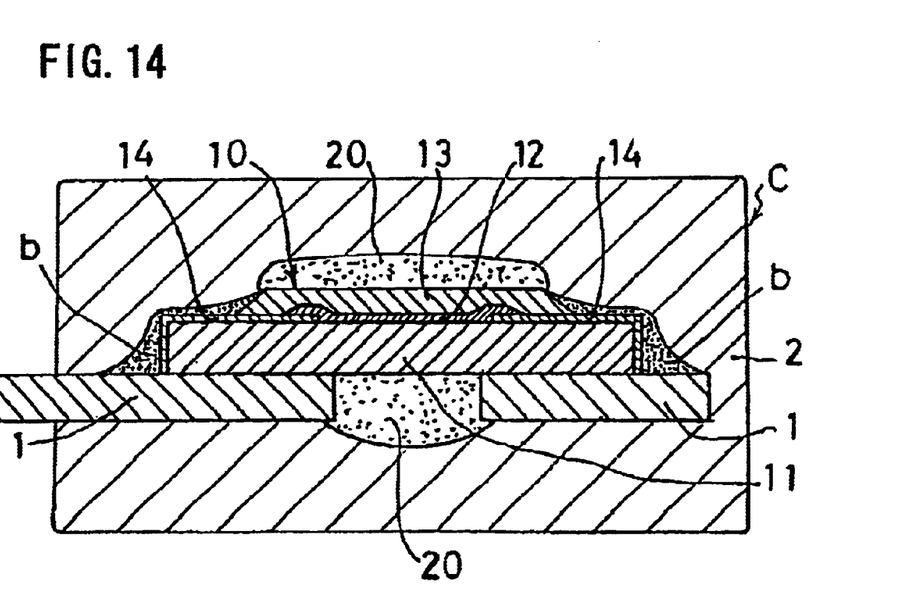
FIG. 14 is a sectional view of a fifth embodiment of the resistor connector of the first embodiment of the present invention.

As to the manner of formation of silicon resin buffer layer 20 at the interface between reference 10 and mold resin 2, only the top plane of resistor 10 may be covered as shown in FIG. 10, in addition to the manner shown in FIG. 2. Alternatively, the leading end portion of lead frame 1 and the entire resistor 10 may be covered as shown in FIG. 11. As shown in FIG. 12, the entire resistor 10 may be covered at the top side of the leading end of lead frame 1, and have buffer layer 20 also located at the bottom side of the leading end of lead frame 1 to cover the rim portion. As shown in FIG. 13, only the entire resistor 10 may be covered at the top side of the leading end of lead frame 1. The bottom side and the side plane of lead frame 1 are not covered. As shown in FIG. 14, only the top plane of resistor 10 and the gap between lead frames 1, 1 may be covered.

Second Embodiment

A manufacturing method of a resistor connector according to a second embodiment of the present invention will be described with reference to FIG. 15. The step up to formation of the lead frame shown in FIG. 3 is identical to that of the first embodiment.

Figure 15:
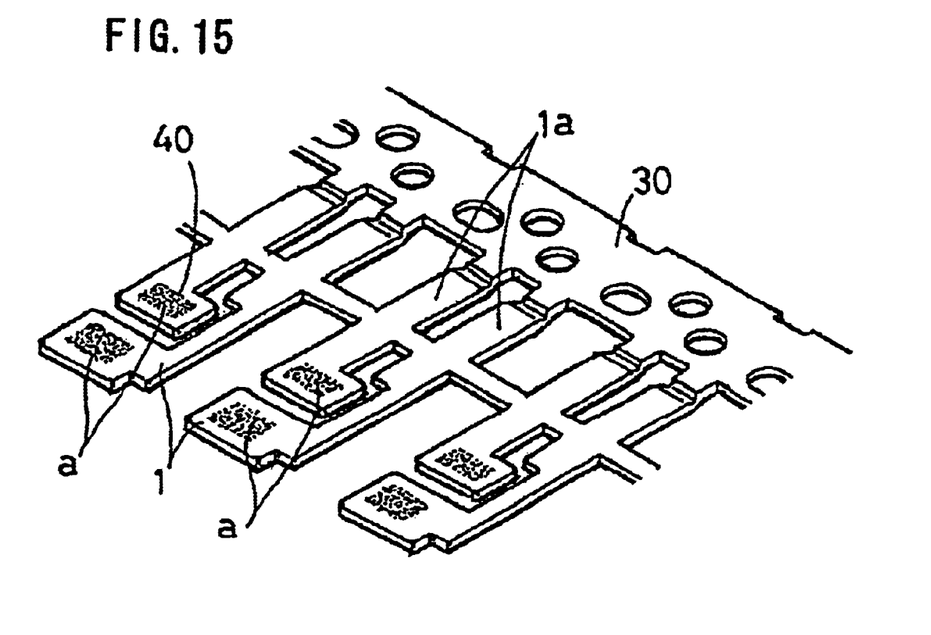
FIG. 15 is a diagram to describe a manufacturing method of a resistor connector of a second embodiment of the present invention.

In the present embodiment, a silver coat a is applied only at the solder land region, as shown in FIG. 15, instead of covering the entire leading end of lead frame 1a as in the first embodiment. Regarding the region of the Ni coat entirely covering lead frame 1, the neighborhood region enclosing the perimeter of e region covered with silver plate a is formed as wall 40. By the presence of the Ni coat located at the outer side immediately lateral to the silver coat, the flow of solder is prevented due to the low wettability of the Ni coat with respect to solder. According to the manufacturing method of the resistor connector of the present embodiment, steps identical to those described with reference to FIGS. 6–9 are carried out subsequent to the process of FIG. 15 to obtain resistor connector C.

Third Embodiment

Figure 16:
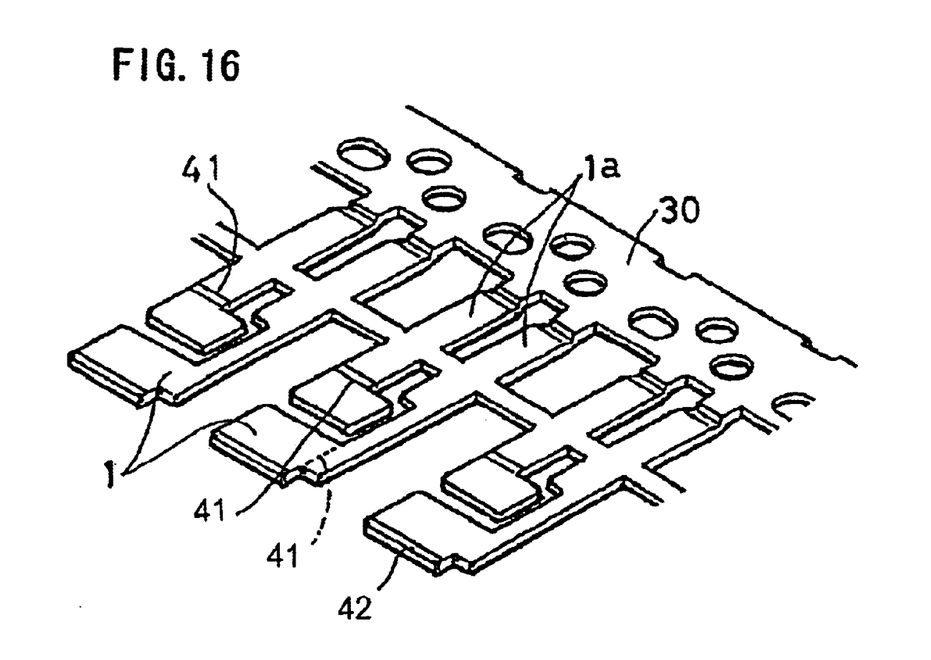
FIG. 16 is a diagram to describe a manufacturing method of a resistor connector of a third embodiment of the present invention.

A manufacturing method of a resistor connector according to a third embodiment of the present invention will be described with reference to FIG. 16. Although the manufacturing method is basically similar to the resistor connector manufacturing method described in the first or second embodiment, a V-shaped trench 41 is formed in lead frame 1, as shown in FIG. 16, instead of wall 40. The flow of solder can be prevented by trench 41. In the example of FIG. 16, trench 41 is formed only at one of the lead frames 1 forming a pair (the shorter lead frame 1). This is because there is sufficient distance from the electrode connection portion (solder land region) to terminal portion 1a at the other lead frame 1 (longer lead frame 1).

As shown by the chain dotted line in FIG. 16, a trench 41 can be formed in the area from the leading end towards the root in longer lead frame 1. In the example of FIG. 16, another trench 42 is also provided at the outer edge of longer lead frame 1. Trench 42 serves to prevent the flow of the solder from the leading edge of lead frame 1, and may be omitted. In the resistor connector manufacturing method of the present invention, steps similar to those of FIG. 4 and et seq. are carried out subsequent to the step shown in FIG. 16, or steps similar to those of FIG. 6 and et seq. are carried out subsequent to the process of FIG. 15 to obtain resistor connector C. The process of forming silver coat a and wall 40 may be omitted appropriately as long as the attachment of resistor 10 is not degraded.

Fourth Embodiment

Figures 17, 18, 19, 20:
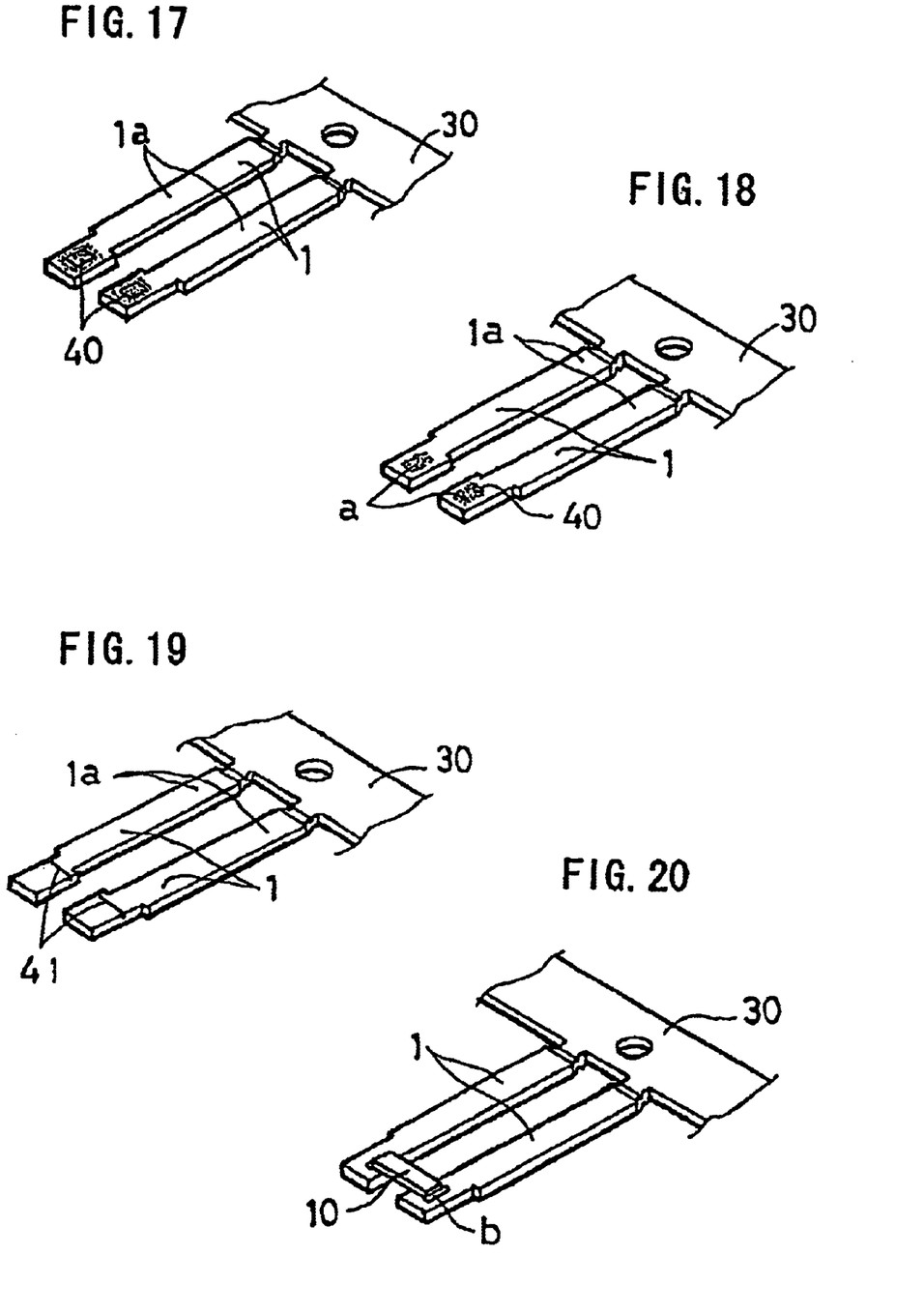
FIG. 17 is a perspective view of a first example of a lead frame employed in a manufacturing method of a resistor connector of a fourth embodiment of the present invention.
FIG. 18 is a perspective view of a second example of a lead frame employed in the manufacturing method of the resistor connector of the fourth embodiment of the present invention.
FIG. 19 is a perspective view of a third example of a lead frame employed in the manufacturing method of the resistor connector of the fourth embodiment of the present invention.
FIG. 20 is a perspective view of the state where the lead frame employed in the manufacturing method of the resistor connector of the fourth embodiment of the present invention is connected to a resistor.

The distance between paired terminal portions 1a and 1a is determined depending upon the terminal width of the female connector into which the resistor connector is to be fitted. In each of the above embodiments, resistor 10 is mounted so as to bridge across the pair of lead frames 1 in the longitudinal direction since the distance thereof is small. In the case where resistor 10 is attached so as to bridge across the pair of lead frames in the width direction as shown in FIG. 17, lead frame 1 can include wall 40 or trench 41 applying the approaches of the first to third embodiments, as shown in FIGS. 17–19. Resistor 10 is attached as shown in FIG. 20 to any of such lead frames 1 to obtain a resistor connector in a manner similar to that described above.

In each of the above embodiments, wall 40 and trench 41 may both be employed together. A manner other than that in each of the above embodiments can be employed appropriately as long as the attachment of resistor 10 is not degraded. In the step shown in FIG. 5, a wall 40 may be formed by Ni plating or chromium plating instead of resist printing. Furthermore, a chromium coat may be employed instead of the Ni coat that entirely covers lead frame 1. In the case where lead frame 1 is not entirely coated, only the boundary line of the solder land region may be formed of Ni or chromium coating. On this occasion, the solder land region is preferably subjected to silver coating a. The present invention can employ various solder besides An—Ag eutectic solder.

The above embodiments disclosed herein are by way of illustration and example only, and are not to be taken by way of limitation. The scope of the present invention is defined by the appended claims rather than by the description above, and includes all changes that fall within the limit of the claims, or equivalence of such metes and bounds.

Industrial Applicability

The present invention is applicable to a resistor connector used to restrict the current value of a control circuit, or detect the resistance value to conduct identification of electrical components.

What is claimed is:

1. A resistor connector manufacturing method comprising:
    a connection step of providing solder at an electrode connection portion of a pair of parallel lead frames by printing, and electrically connecting a resistor to said electrode connection portion through said solder,
    a covering step of covering said resistor with a mold resin so as to expose a terminal portion of said lead frame, and
    a thermal treating process of exposing a flux solid component of said solder for at least 20 minutes at a temperature of at least 235° C. and not more than 255° C. to carbonize, and for volatilization of a volatile component, prior to said covering step.

2. The resistor connector manufacturing method according to claim 1, wherein said thermal treating step is carried out after said connection step.

3. The resistor connector manufacturing method according to claim 1, wherein said solder is lead free solder.

4. The resistor connector manufacturing method according to claim 1, wherein said lead frame is subjected to nickel coating all over, and subjected to silver coating at said electrode connection portion.

5. The resistor connector manufacturing method according to claim 1, wherein said lead frame having a wall formed between said electrode connection portion and said terminal portion is used.

6. The resistor connector manufacturing method according to claim 1, wherein said lead frame having a trench formed between said electrode connection portion and said terminal portion is used.

7. The resistor connector manufacturing method according to claim 1, comprising the step of forming a buffer layer on at least a top plane of said resistor, after said connection step and before said covering step.

8. The resistor connector manufacturing method according to claim 1, wherein said lead frame is subjected to a chromium coating.

9. The resistor connector manufacturing method according to claim 1, wherein said lead frame is subjected to nickel coating.

* * * * *